United States Patent
Adachi (10) Patent No.: US 7,626,387 B2
(45) Date of Patent: Dec. 1, 2009

(54) MRI APPARATUS AND METHOD USING SAMPLE FILTERING BASED ON TIME SHIFTS CAUSED BY TEMPORAL VARIATIONS IN MAGNETIC FIELD STRENGTH

(75) Inventor: Kohei Adachi, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/078,388

(22) Filed: Mar. 31, 2008

(65) Prior Publication Data

US 2008/0246475 A1      Oct. 9, 2008

(30) Foreign Application Priority Data

Apr. 5, 2007   (JP) .............................. 2007-099243

(51) Int. Cl.
*G01V 3/00*     (2006.01)

(52) U.S. Cl. ...................................................... 324/307

(58) Field of Classification Search ......... 324/300–322; 600/410–435

See application file for complete search history.

(56) References Cited

U.S. PATENT DOCUMENTS

| 5,084,675 A | 1/1992 | Reinfelder et al. |
| 5,560,361 A | 10/1996 | Glusick |
| 6,771,067 B2 * | 8/2004 | Kellman et al. ............. 324/307 |

FOREIGN PATENT DOCUMENTS

JP          3112926          9/2000

* cited by examiner

*Primary Examiner*—Brij B. Shrivastav
*Assistant Examiner*—Dixomara Vargas
(74) *Attorney, Agent, or Firm*—Nixon & Vanderhye PC (57) ABSTRACT

An MRI apparatus includes a filtering control unit that filters discrete MR-signal values. A filter-coefficient setting unit sets a plurality of filter coefficients with respect to each point of sampling time, based on time-shift amounts corresponding to variations in an MR-signal frequency arising from temporal variations in the magnetic field strength. A product-sum operating unit filters the MR-signal values by performing a product-sum operation between the filter coefficients and the MR-signal values. An image-data creating unit creates image data based on the MR-signal values on which the filtering processing is performed.

9 Claims, 8 Drawing Sheets

MRI APPARATUS AND METHOD USING SAMPLE FILTERING BASED ON TIME SHIFTS CAUSED BY TEMPORAL VARIATIONS IN MAGNETIC FIELD STRENGTH

CROSS-REFERENCE TO RELATED APPLICATIONS

This application is based upon and claims the benefit of priority from the prior Japanese Patent Application No. 2007-099243, filed on Apr. 5, 2007; the entire contents of which are incorporated herein by reference.

BACKGROUND OF THE INVENTION

1. Field of the Invention

The present invention relates to an MRI apparatus, and particularly relates to an MRI apparatus that can correct variations in an MR-signal frequency caused by temporal variations in a readout gradient magnetic field.

2. Description of the Related Art

A magnetic resonance imaging (MRI) method is an imaging method in which a nuclear spin in a subject tissue placed in a static magnetic field is excited with a high-frequency signal (RF pulse) of a Larmor frequency, and image data is reconstructed from a magnetic resonance signal (MR signs)) generated along with the excitation.

An MRI apparatus is a diagnostic imaging apparatus that creates image data based on MR signals detected from the inside of a living body, and can obtain various diagnostic information, such as biochemical information and functional diagnosis information as well as anatomical diagnosis information. Therefore, the MRI apparatus is indispensable to a field of recent diagnostic imaging.

The MRI apparatus includes a magnetic-field generating unit that generates a static magnetic field and various gradient magnetic fields to a subject, a transmitting/receiving unit that irradiates RF pulses to an imaging target portion of the subject to which the magnetic fields are applied, and performs various signal processing on an MR signal detected from the imaging target portion irradiated with the RF pulses, an image-data creating unit that creates image data by performing reconstruction processing on the processed MR signal, and a display unit that displays thereon the created image data. The transmitting/receiving unit includes a transmitting coil that irradiates RF pulses to the subject, a transmitting unit that activates the transmitting coil, a receiving coil that detects an MR signal generated from the subject, and a receiving unit that performs signal processing, such as frequency conversion and A/D conversion, on the MR signal obtained by the receiving coil.

Figure 9:
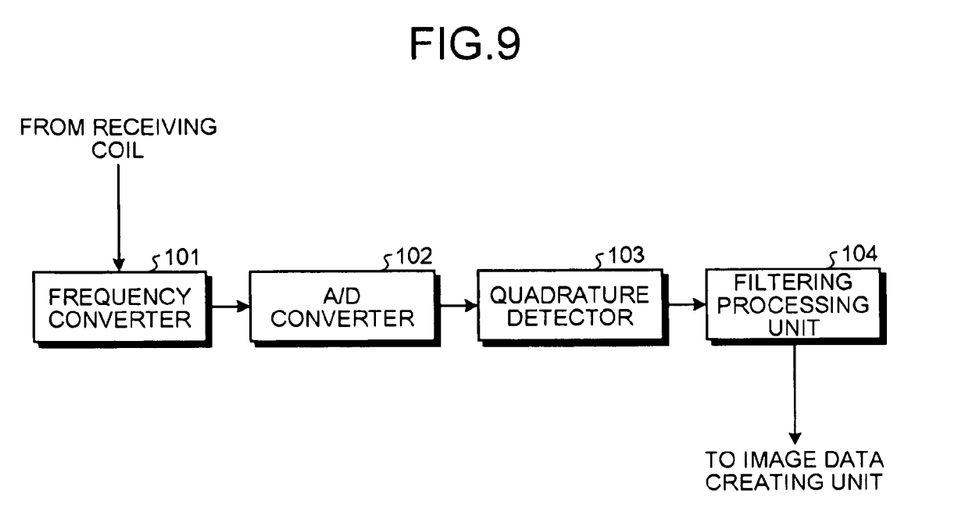
FIG. 9 is a block diagram illustrating a basic configuration of a receiving unit included in a conventional MRI apparatus.

The receiving unit includes, for example, as shown in FIG. 9, a frequency converter 101, an A/D converter 102, a quadrature detector 103, and a filtering processing unit 104. The frequency converter 101 converts the frequency of an MR signal detected by the receiving coil. The A/D converter 102 performs an A/D conversion on the MR signal converted in frequency. The quadrature detector 103 converts the A/D-converted MR signal into a complex MR signal having an I component and a Q component by performing quadrature detection. The filtering processing unit 104 eliminates a needless component, such as a noise, by performing filtering processing on the MR signal.

An MRI apparatus sets a slice encoding direction, a readout encoding direction, and a phase encoding direction, which are orthogonal to each other, with respect to an imaging target portion, and applies gradient magnetic fields in the respective directions, thereby setting an image slice cross-section and adding positional information to the MR signal generated from the image slice cross-section. The receiving coil detects an MR signal in time series generated from the subject with a readout gradient magnetic field that is applied after the transmitting coil irradiates an RF pulse to the subject and a certain time period passes over.

In such case, because the frequency of an MR signal is proportional to the strength of an applied magnetic field, it is desirable that magnetic field strengths are uniform during a collection period (readout period) of the MR signal in order to collect an MR signal with a constantly stable frequency from a certain position. However, it is difficult in practice to obtain a magnetic field in which activation time is short and strength is substantially uniform during the readout period, such as a magnetic-field characteristic with rectangle or trapezoid shape, due to constraints, such as a limitation of a gradient magnetic field power-source or the like, consequently, a sinusoidal-shaped readout gradient magnetic field is used in many cases.

When applying a readout gradient magnetic field having such magnetic-field characteristic to the subject, the frequency of an MR signal generated from the same portion varies along with temporal variations in the magnetic field strength. As a result, when creating image data by performing the A/D conversion and then the reconstruction processing on the MR signal collected in the readout encoding direction, an image distortion caused by the variations in the frequency of the MR signal arises in the image data obtained by performing a Fourier transform on the MR signal obtained by sampling at an equal interval.

To reduce image distortions arising due to variations in the magnetic field strength, a method is proposed such that a time interval is preset to have a constant time-integral value of a gradient magnetic field in an arbitrary waveform applied to the subject, an MR signal obtained by sampling at an unequal interval based on the time interval is rearranged at an equal interval, and then filtering processing and image reconstruction processing are performed (for example, see Japanese Patent No. 3112926).

According to the method described in Japanese Patent No. 3112926, to begin with, an MR signal is extracted by sampling at an unequal interval set based on temporal variations in a readout gradient magnetic field, and then a needless component mixed in the obtained MR signal is eliminated by performing filtering processing on the MR signal. In other words, because the filtering processing for eliminating a needless signal is performed on the MR signal of which MR-signal frequency is corrected, such processing requires a number of periods, consequently, the method has a problem that a real-time quality of image data is deteriorated.

SUMMARY OF THE INVENTION

According to one aspect of the present invention, an MRI apparatus includes an application unit that applies a readout gradient magnetic field in which magnetic field strength thereof varies with time and RF pulses to a subject placed in a static magnetic field in accordance with a predetermined pulse sequence; a receiving unit that receives an MR signal obtained from the subject to which the readout gradient magnetic field and the RF pulses are applied; an AD converter that converts the received MR signal from analog to digital, and samples discrete MR-signal values; a filtering processing unit that performs filtering processing on the sampled discrete MR-signal values, including a filter-coefficient setting unit that sets a plurality of filter coefficients to be used for the filtering processing with respect to each point of sampling time at which the filtering processing is to be performed, based on time-shift amounts corresponding to variations in an MR-signal frequency arising from temporal variations in the magnetic field strength, and a product-sum operating unit that performs the filtering processing on the MR-signal values by performing a product-sum operation between the filter coefficients and the MR-signal values; and an image-data creating unit that creates image data based on the MR-signal values on which the filtering processing is performed.

According to another aspect of the present invention, an MRI method includes applying a readout gradient magnetic field in which-magnetic field strength thereof varies with time and RF pulses to a subject placed in a static magnetic field in accordance with a predetermined pulse sequence; receiving an MR signal obtained from the subject to which the readout gradient magnetic field and the RF pulses are applied; converting the received MR signal from analog to digital, and sampling discrete MR-signal values; performing filtering processing on the sampled discrete MR-signal values, by setting a plurality of filter coefficients to be used for the filtering processing with respect to each point of sampling time at which the filtering processing is to be performed, based on time-shift amounts corresponding to variations in an MR-signal frequency arising from temporal variations in the magnetic field strength, and performing the filtering processing on the MR-signal values by performing a product-sum operation between the filter coefficients and the MR-signal values; and creating image data based on the MR-signal values on which the filtering processing is performed; and creating image data based on the MR-signal values on which the filtering processing is performed.

DETAILED DESCRIPTION OF THE INVENTION

Exemplary embodiments of the present invention will be explained below with reference to the accompanying drawings.

In the following embodiment of the present invention, when eliminating with a digital filter various noise components superimposed on an MR signal after quadrature detection collected at a predetermined sampling interval, resampling time corresponding to the signal band of the MR signal is set for the MR signal sampled at sampling time with the predetermined interval, and furthermore, the resampling time is corrected based on magnetic-field characteristic of readout gradient magnetic field that varies with time. Discrete standard filter-coefficients preset at the sampling interval are then interpolated, filter coefficients of a filter function with a center on one of the corrected resampling time are calculated with respect to respective points of the sampling time, and MR-signal amplitude values at the corrected resampling time are calculated by convolution integral of the interpolated filter coefficients and MR-signal amplitude values collected at the sampling interval. The MR signal amplitude values at the resampling time before correction are then replaced with the MR-signal amplitude values obtained at the corrected resampling time, so that variations in the MR-signal frequency along with temporal variations in the readout gradient magnetic field are corrected.

(Configuration of Apparatus)

Figure 1:
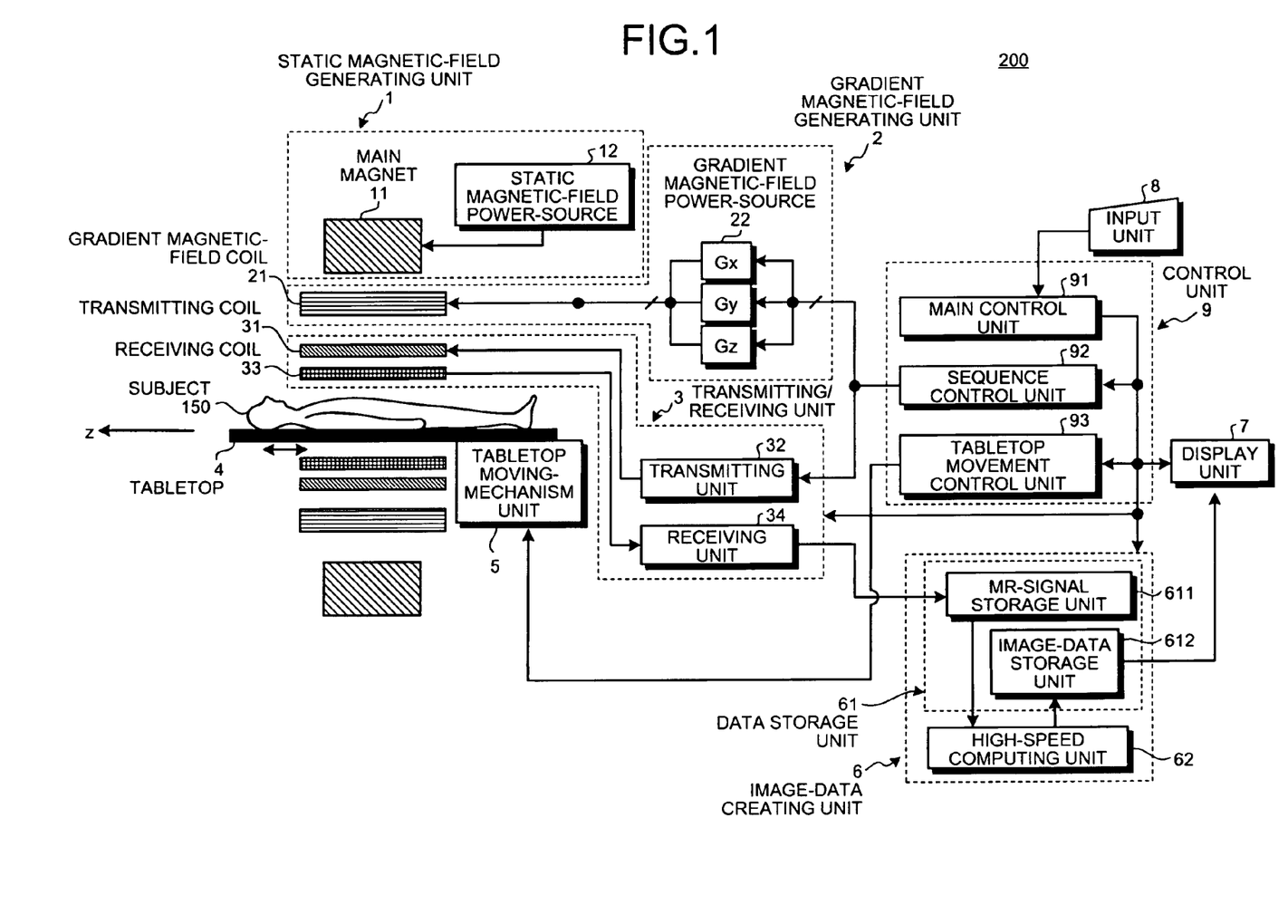
FIG. 1 is a block diagram illustrating a general configuration of an MRI apparatus according to an embodiment of the present invention.

A configuration of an MRI apparatus according to an embodiment of the present invention is explained below with reference to FIGS. 1 to 6. FIG. 1 is a block diagram illustrating a general configuration of the MRI apparatus according to the embodiment, and FIG. 3 is a block diagram illustrating a configuration of a receiving unit included in the MRI apparatus. FIG. 6 is a block diagram of a specific configuration of a filtering processing unit included in the receiving unit.

An MRI apparatus 200 shown in FIG. 1 includes a static magnetic-field generating unit 1 and a gradient magnetic-field generating unit 2 both of which generate magnetic fields to a subject 150, a transmitting/receiving unit 3 that irradiates RF pulses to the subject 150 and receives an MR signal, a tabletop 4 of a patient couch on which the subject 150 is placed, and a tabletop moving-mechanism unit 5 that moves the tabletop 4 in the direction of the body axis of the subject 150.

Moreover, the MRI apparatus 200 includes an image-data creating unit 6 that creates image data by performing reconstruction processing on the MR signal received by the transmitting/receiving unit 3, a display unit 7 that displays thereon the created image data, an input unit 8 that performs setting of conditions of MR-signal collection and conditions of image data display, input of various command signals, and the like, and a control unit 9 that controls each of the above units included in the MRI apparatus 200.

The static magnetic-field generating unit 1 includes a main magnet 11 that is made from, for example, a normal conducting magnet or a superconducting magnet, and a static magnetic-field power-source 12 that supplies an electric current to the main magnet 11, and generates a high-powered static magnetic field G0 to the subject 150 arranged in an imaging field in a not-shown gantry. The main magnet 11 can also be made from a permanent magnet.

The gradient magnetic-field generating unit 2 includes gradient magnetic-field coils 21 that generate gradient magnetic fields in the x-axis direction, the y-axis direction and the z-axis direction, which are orthogonal to each other, and a gradient magnetic-field power-source 22 that supplies a pulse current to each of the gradient magnetic-field coils 21.

The gradient magnetic-field power-source 22 performs encoding on the imaging field in which the subject 150 is placed based on a sequence control signal supplied from a sequence control unit 92 of the control unit 9, which will be described later. In other words, the gradient magnetic-field power-source 22 generates gradient magnetic fields Gx, Gy, and Gz in the x-axis direction, the y-axis direction, and the z-axis direction, respectively by controlling a pulse current supplied to each of the gradient magnetic-field coils 21 for the respective directions based on the sequence control signal supplied from the control unit 9. The gradient magnetic fields Gx, Gy, and Gz in the x-axis direction, the y-axis direction, and the z-axis direction, respectively are then combined, and a slice-selective gradient magnetic field Gs, a phase encoding gradient magnetic field Ge, and a readout (frequency encoding) gradient magnetic field Gr, which are orthogonal to each other, are generated in desired directions. The thus generated gradient magnetic fields are superposed on the static magnetic field G0 generated by the main magnet 11, then applied to the subject 150.

Figure 2:
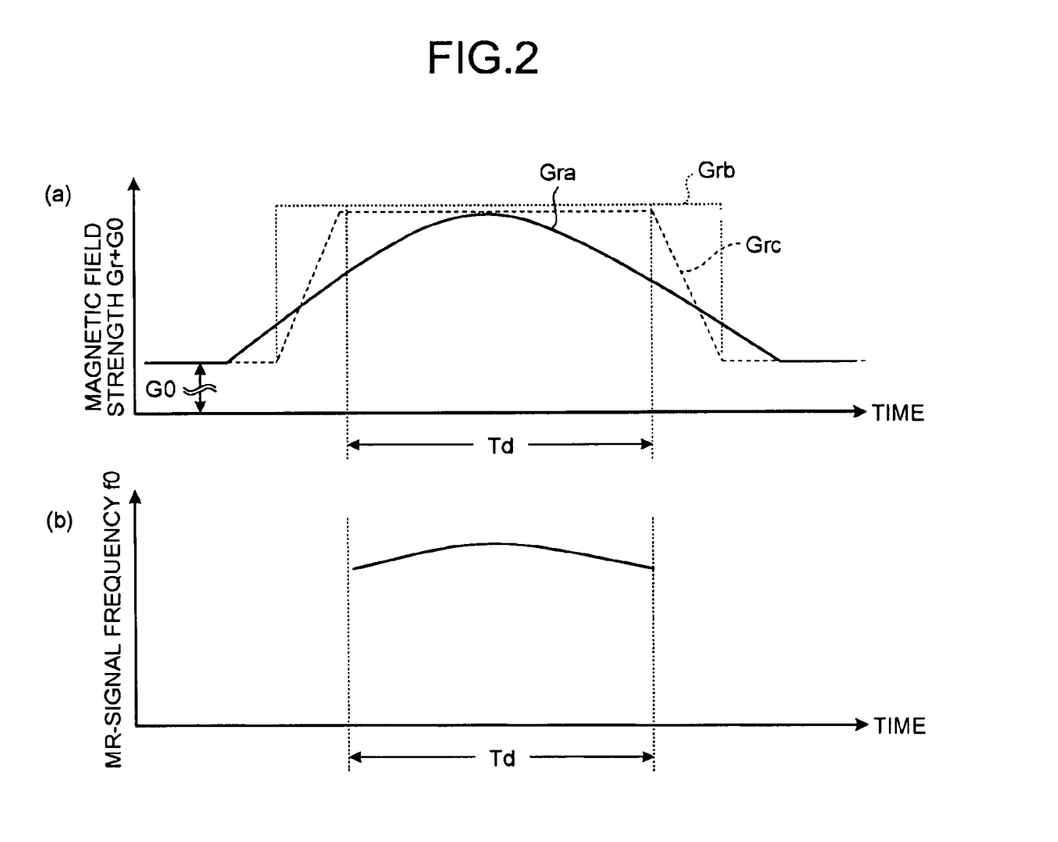
FIG. 2 is a schematic diagram for explaining characteristics of magnetic field strength of readout gradient magnetic field and variations in an MR-signal frequency along with temporal variations in a sinusoidal readout gradient magnetic field.
Figure 3:
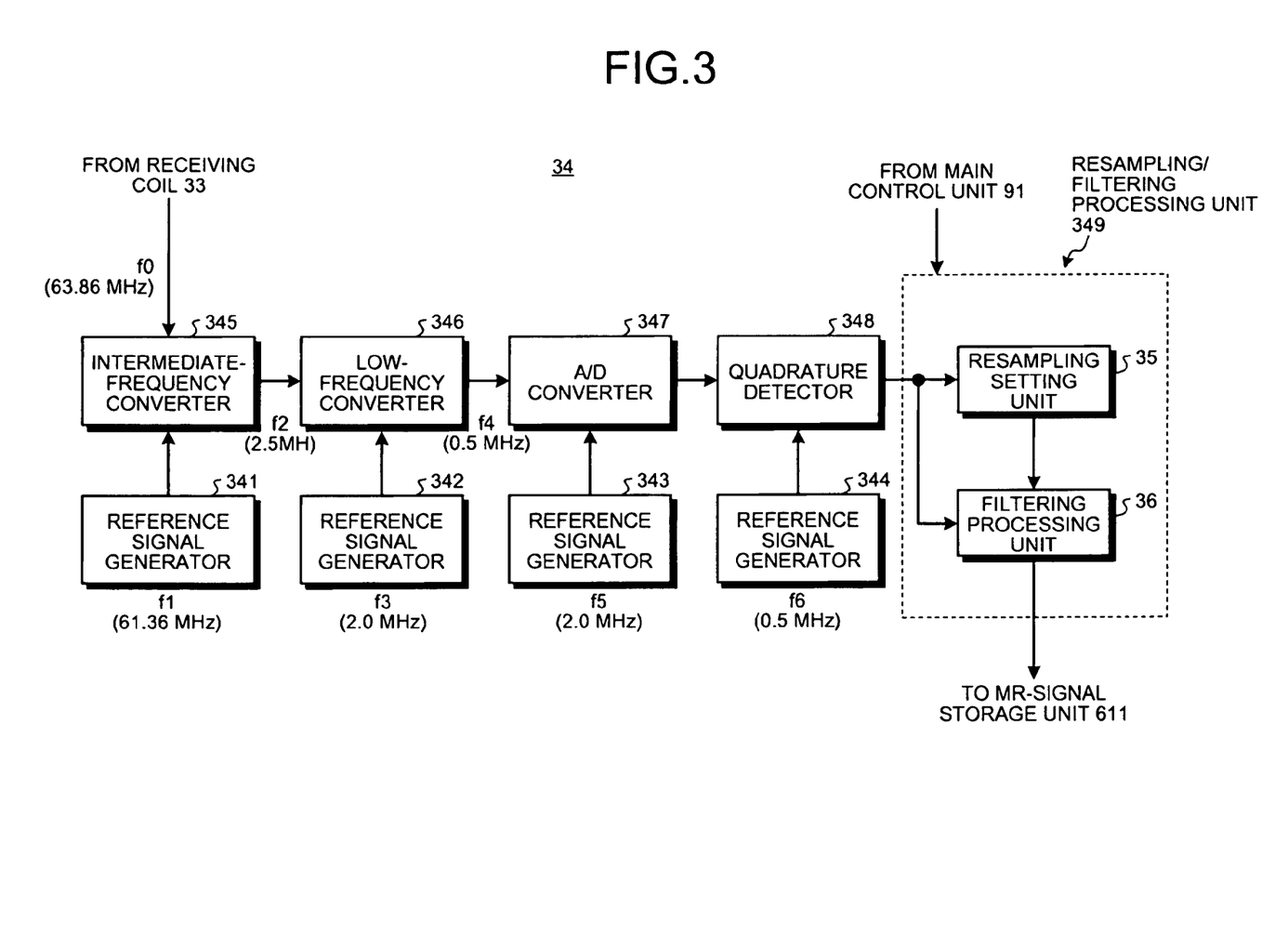
FIG. 3 is a block diagram illustrating a configuration of a receiving unit included in the MRI apparatus according to the embodiment of the present invention.

FIG. 2 depicts characteristics of magnetic field strength of the readout gradient magnetic field applied to a certain portion of the subject 150 together with the static magnetic field G0 (shown by (a) in FIG. 2), and variations in the MR-signal frequency along with temporal variations in a sinusoidal readout gradient magnetic field Gra (shown by (b) in FIG. 2). As already described above, it is desirable to apply a rectangle readout gradient magnetic field Grb or a trapezoidal readout gradient magnetic field Grc, each of which has a uniform magnetic field strength during an MR-signal readout period Td, however, the sinusoidal readout gradient magnetic field Gra is usually applied due to constraints of the gradient magnetic-field power-source 22.

When the static magnetic field G0 and the sinusoidal readout gradient magnetic field Gra are applied to the subject 150, a frequency f0 of the MR signal generated from a micro region is expressed below in Equation (1), and the frequency f0 of the MR signal varies along with temporal variations in the readout gradient magnetic field Gra as shown by (b) in FIG. 2. A symbol γ in Equation (1) is a constant called as a gyromagnetic ratio, which is unique to a nuclide.

$$f0=\gamma(G0+Gra)/2\pi \quad (1)$$

Next, the transmitting/receiving unit 3 in FIG. 1 includes a transmitting coil 31 and a transmitting unit 32 that irradiate RF pulses to the subject 150, and a receiving coil 33 and a receiving unit 34 that receive an MR signal generated from the subject 150. However, a transmitting/receiving coil that performs a function of the transmitting coil 31 and a function of the receiving coil 33 as one coil can be used.

The transmitting unit 32 generates RF-pulse currents each of which has a carrier wave of the same frequency as a magnetic-resonance frequency (Larmor frequency) determined in accordance with the strength of the static magnetic field of the main magnet 11, and is modulated with a predetermined selective-excitation waveform, based on a sequence control signal supplied from the sequence control unit 92 of the control unit 9. The transmitting coil 31 is activated with the RF-pulse currents supplied from the transmitting unit 32, and irradiates RF pulses to an imaging target portion of the subject 150.

The receiving coil 33 is constructed from so-called multichannel coil that a plurality of coil elements having a small diameter is arranged to detect an MR signal generated from the subject 150 at a high sensitivity. The main magnet 11, the gradient magnetic-field coils 21, the transmitting coil 31, and the receiving coil 33 are provided on the gantry of the MRI apparatus 200, and the imaging field is formed in the central area of the gantry. In other words, the imaging field into which the subject 150 is to be inserted together with the tabletop 4 is provided in the center of the gantry, and the receiving coil 33, the transmitting coil 31, the gradient magnetic-field coils 21, and the main magnet 11 are arranged around the imaging field coaxially with one another having the z axis as the axis of concentric circles.

A configuration of the receiving unit 34 of the transmitting/receiving unit 3 is explained below with reference to a block diagram in FIG. 3. The receiving unit 34 in FIG. 3 includes reference signal generators 341 to 344 that generate reference signals of frequencies f1, f3, f5, and f6, an intermediate-frequency converter 345 and a low-frequency converter 346 that perform frequency conversion on an MR signal, an A/D converter 347, a quadrature detector 348, and a resampling/filtering processing unit 349.

An MR signal of the frequency f0 (for example, f0=63.86 MHz) detected by the receiving coil 33 is then converted by the intermediate-frequency converter 345 into an MR signal of a frequency f2 (f2=f0−f1=2.5 MHz) by mixing with the reference signal of the frequency f1 (f1=61.36 MHz) supplied from the reference signal generator 341, and further converted by the low-frequency converter 346 into an MR signal of a frequency f4 (f4=f2−f3=0.5 MHz) by mixing with the reference signal of the frequency f3 (f3=2.0 MHz) supplied from the reference signal generator 342.

The MR signal output from the low-frequency converter 346 is then supplied to the A/D converter 347, and the A/D converter 347 performs sampling/holding and A/D conversion on the MR signal, for example, in a cycle T5 (T5=1/f5=0.5 μsec). The MR signal converted into a digital-signal and supplied to the quadrature detector 348 is further performed quadrature detection with the reference signal of the frequency f6 (f6=0.5 MHz) supplied form the reference signal generator 344, and converted into a baseband MR signal that includes an I component (real component) and a Q component (imaginary component), then supplied to the resampling/filtering processing unit 349. The baseband MR signal contains a mixed component that is a summed frequency component (f4+f6) generated in the quadrature detection. The summed frequency component is hereinafter referred to as a needless MR signal.

The resampling/filtering processing unit 349 includes a resampling setting unit 35 and a filtering processing unit 36. The resampling setting unit 35 sets a resampling interval and resampling time (resampling positions) for the baseband MR signal output from the quadrature detector 348 based on the sampling cycle T5 used by the A/D converter 347 such that a signal band of the MR signal (for example, from 4 KHz to 200 KHz) is taken into account for the resampling interval and the resampling time. The resampling/filtering processing unit 349 does not perform filtering after creating a resampling signal with respect to the baseband MR signal output from the quadrature detector 348, but performs resampling and filtering simultaneously.

Figure 4:
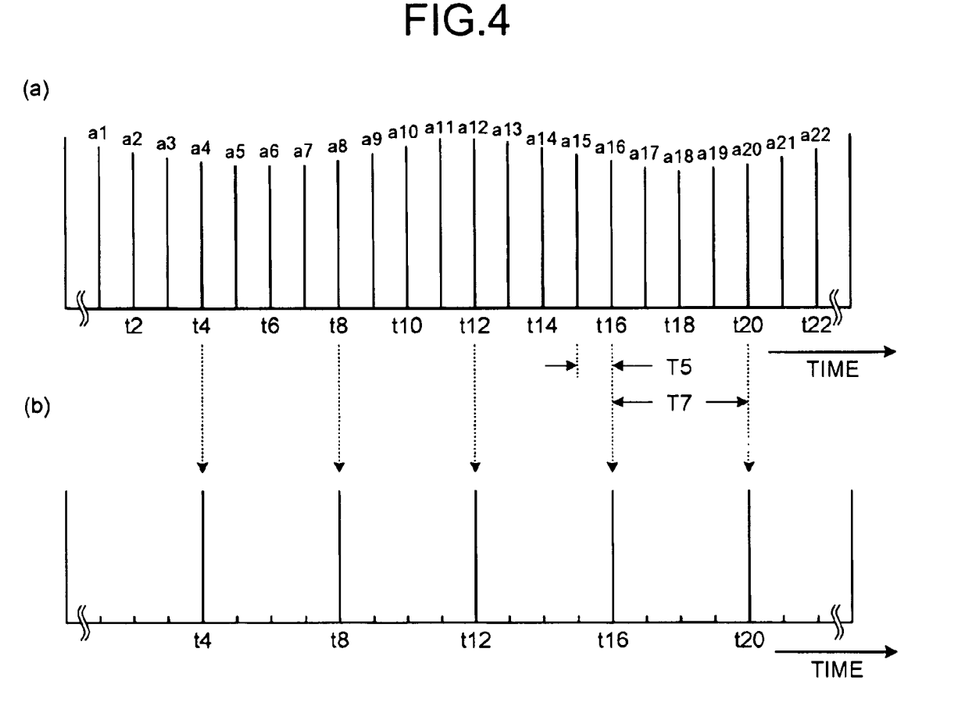
FIG. 4 is a schematic diagram illustrating resampling time for an MR signal in the embodiment.

FIG. 4 depicts resampling time by the resampling setting unit 35 for an MR signal of the sampling cycle T5, (a) of FIG. 4 depicts sampling time in a data sequence of an MR signal supplied in the sampling cycle T5 from the quadrature detector 348, and (b) of FIG. 4 depicts resampling time in a cycle T7 set by the resampling setting unit 35 with respect to the data sequence of the MR signal.

When the maximum frequency component contained in the baseband MR signal supplied from the quadrature detector 348 is, for example, 200 KHz as described above, an occurrence of an artifact caused by aliasing can be suppressed by sampling the MR signal at a frequency of 400 KHz or higher. On the other hand, if the baseband MR signal is sampled at a needlessly high frequency (for example, f5=2.0 MHz) as shown in (a) of FIG. 4, a problem arises that it takes an extensive time to perform filtering processing, which will be described later, of which object is to eliminate the needless MR signal superimposed on the MR signal, and to perform reconstruction processing based on the MR signal.

To avoid this, the resampling setting unit 35 sets resampling time at the sampling interval T7 (for example, T7=1/f7=2 μsec) for an MR-signal data sequence with the sampling interval T5 (T5=1/f5=0.5 μsec) that is sampled at f5=2.0 MHz by the A/D converter 347. Namely, as shown in (a) of FIG. 4, resampling time t4, t8, t12, . . . are set by the resampling setting unit 35 with respect to the MR-signal data sequence that has amplitude values a1, a2, a3, . . . obtained at sampling time t1, t2, t3, . . . in the cycle T5.

Furthermore, when the readout gradient magnetic field Gra is applied to the subject 150, the resampling setting unit 35 corrects the resampling time t4, t8, t12, . . . to correct variations in the MR-signal frequency arising along with temporal variations in the magnetic field strength, and newly sets resampling time tx4, tx8, tx12, . . . , and so on. The resampling time tx4, tx8, tx12, . . . are hereinafter referred to as corrected resampling time.

A setting process of corrected resampling time is explained below with reference to FIG. 5 by using an example of the corrected resampling time tx4 to be newly set with respect to the resampling time t4.

Figure 5:
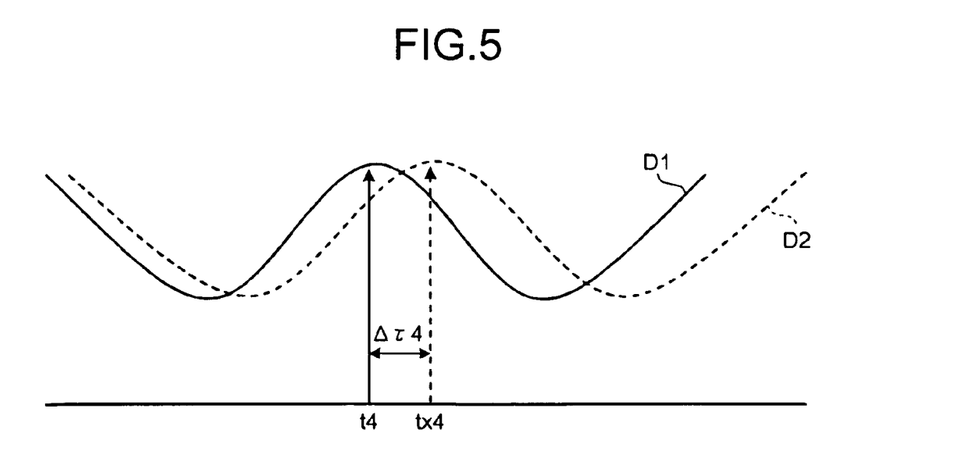
FIG. 5 is a schematic diagram illustrating a setting process of corrected resampling time according to the embodiment.
Figure 6:
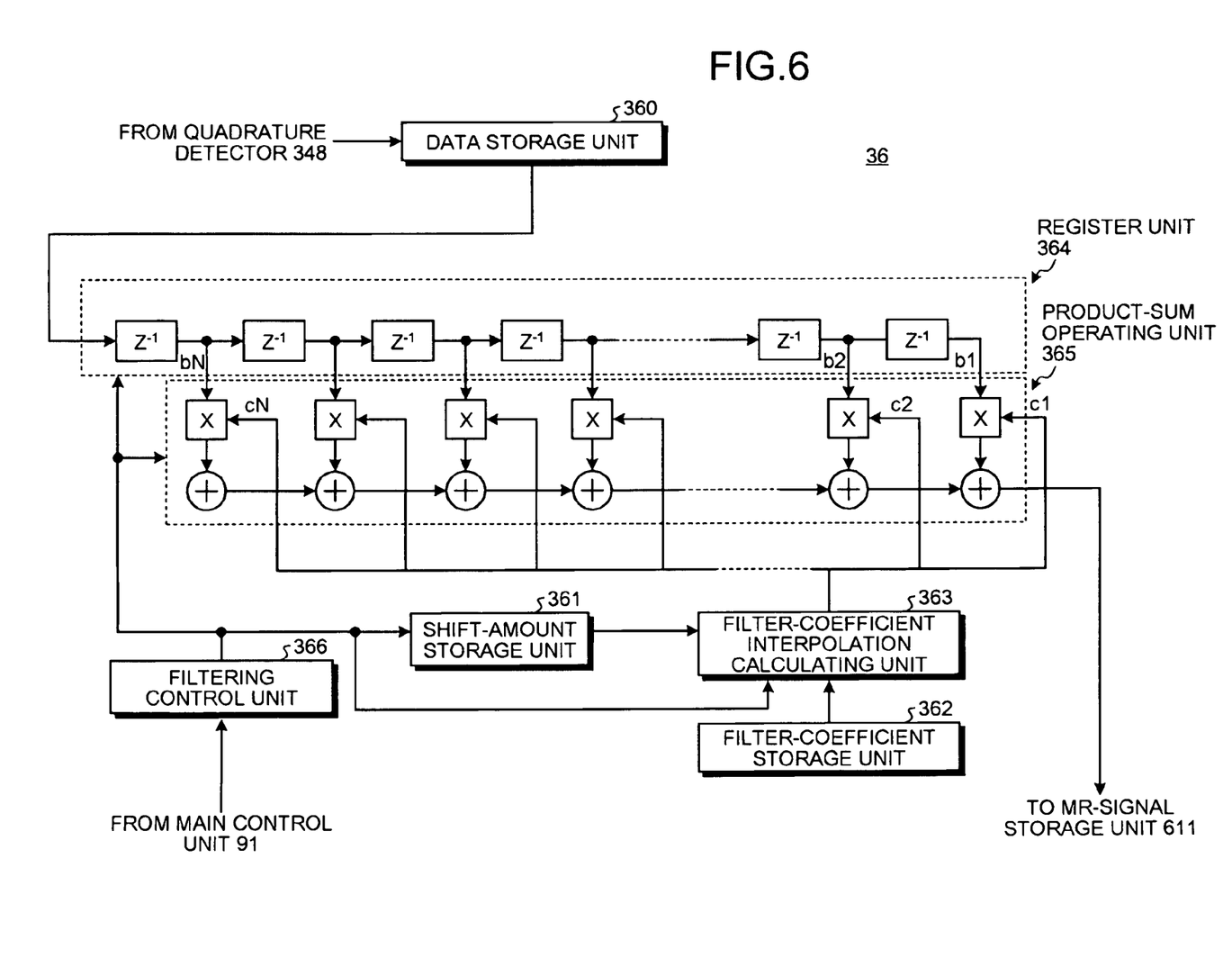
FIG. 6 is a block diagram illustrating a specific configuration of a filtering processing unit included in the receiving unit of the embodiment.

FIG. 5 depicts an MR signal D1 and an MR signal D2. The MR signal D1 is obtained by applying a readout gradient magnetic field of which magnetic field strength does not vary with time (i.e., the rectangle readout gradient magnetic field Grb or the trapezoidal readout gradient magnetic field Grc). The MR signal D2 is obtained by applying the sinusoidal readout gradient magnetic field Gra, of which magnetic field strength varies with time.

When a readout gradient magnetic field of which magnetic field strength does not vary with time during the MR-signal readout period Td, such as the rectangle readout gradient magnetic field Grb or the trapezoidal readout gradient magnetic field Grc shown in (a) of FIG. 2, is applied, an image data without artifact and distortion can be created by collecting the MR signal D1 obtained by the application at the resampling time t4, t8, t12, . . . in the cycle T7 set by the resampling setting unit 35 based on the maximum frequency component of the MR signal (see FIG. 4).

By contrast, when the sinusoidal readout gradient magnetic field Gra, of which magnetic field strength varies with time during the MR-signal readout period Td is applied, the frequency of the MR signal D2 obtained by the application varies along with temporal variations in the magnetic field strength as indicated by a broken line shown in FIG. 5.

The resampling setting unit 35 reads a time-shift amount Δτ4, which is set based on such variations in the MR-signal frequency (i.e., the magnetic-field characteristic of the readout gradient magnetic field Gra) and prestored in a shift-amount storage unit 361 of the filtering processing unit 36, which will be described later, and sets the corrected resampling time tx4 that is shifted from the resampling time t4 by Δτ4 based on the time-shift amount Δτ4. In such case, the time tx4 of the MR signal D2 that has the same time phase as a time phase of the MR signal D1 at the resampling time t4 is set as corrected resampling time. Similarly, the resampling setting unit 35 sets corrected resampling time tx8, tx12, tx16, . . . with respect to the resampling time t8, t12, t16, . . . , respectively.

The filtering processing unit 36 performs the filtering processing to eliminate the needless MR signal mixed in the baseband MR signal, and performs a correction to variations in the MR-signal frequency caused by the sinusoidal readout gradient magnetic field Gra in the process of the filtering processing. Precisely, the filtering processing unit 36 eliminates the needless MR signal mixed in the baseband MR signal supplied at the sampling time t1, t2, t3, . . . from the quadrature detector 348, and an MR signal whose variations in the MR-signal frequency caused by the sinusoidal readout gradient magnetic field Gra are corrected is created at the corrected resampling time tx4, tx8, tx12, . . . , and so on. The sampling interval T5 and the resampling interval T7 are not limited to the values described above.

A specific configuration of the filtering processing unit 36, which can perform a correction of the MR-signal frequency, elimination of the needless MR signal, and resampling in this way, is explained below with reference to FIG. 6.

The filtering processing unit 36 shown in FIG. 6 includes a data storage unit 360, the shift-amount storage unit 361, a filter-coefficient storage unit 362, a filter-coefficient interpolation calculating unit 363, a register unit 364, a product-sum operating unit 365, and a filtering control unit 366.

The data storage unit 360 temporarily stores therein an MR signal detected by the receiving coil 33 on which frequency conversion, A/D conversion, quadrature detection, and the like, are performed. The shift-amount storage unit 361 prestores therein time-shift amounts set based on various magnetic-field characteristics of the readout gradient magnetic field. The filter-coefficient storage unit 362 prestores therein discrete standard filter-coefficients that are created at an interval similar to the sampling cycle T5 based on filter characteristics.

The filter-coefficient interpolation calculating unit 363 selects discrete standard filter-coefficients corresponding to a filter characteristic supplied from the input unit 8 via a main control unit 91 of the control unit 9 from among various standard filter-coefficients prestored in the filter-coefficient storage unit 362. Furthermore, the filter-coefficient interpolation calculating unit 363 calculates filter coefficients of a filter function with a center shifted to the corrected resampling time with respect to respective points of the sampling time (hereinafter, referred to as post-interpolation filter-coefficients) by linearly interpolating the standard filter-coefficients based on information about the time-shift amounts supplied from the shift-amount storage unit 361.

The register unit 364 includes a shift register of N bits, and the MR signal D2 sequentially input at the sampling interval T5 from the data storage unit 360 is sequentially shifted in accordance with a clock pulse in the cycle T5. The product-sum operating unit 365 includes N units of product-sum operating subunits including multipliers and adders, each of which is connected to each of N output terminals included in the register unit 364. Each of the product-sum operating subunits performs a multiplication of an amplitude value of the discrete MR signal D2 by each of the post-interpolation filter-coefficients, and the adder combines results of the multiplications. In other words, an amplitude value of the MR signal D2 at each of the corrected resampling time is calculated by performing the product-sum operation.

The filtering control unit 366 controls each of the units described above included in the filtering processing unit 36, and executes the filtering processing by performing the product-sum operation of the discrete MR signal D2 and the post-interpolation filter-coefficients.

The filtering processing and a procedure of the correction of an MR-signal frequency performed by the filtering processing unit 36 are explained below in more detail. Although a case is described below of performing the filtering processing on a discrete MR signal of N=7 collected at the sampling interval T5 with a center on each of the resampling time, the number of data of the MR signal is not limited to seven.

When performing the filtering processing of an MR signal, the filter-coefficient interpolation calculating unit 363 that receives information about a readout gradient magnetic field characteristic, information about filter characteristic, a command signal of the filtering processing, and the like, from the control unit 9 via the filtering control unit 366 of the filtering processing unit 36 shown in FIG. 6, reads standard filter-coefficients c1 to c7 corresponding to the filter characteristic from the filter-coefficient storage unit 362, and furthermore, reads time-shift amounts Δτ4, Δτ8, Δτ12, . . . corresponding to the readout gradient magnetic field characteristic from the shift-amount storage unit 361.

The filter-coefficient interpolation calculating unit 363 then interpolates the standard filter-coefficients c1 to c7 based on each of the time-shift amounts Δτ4, Δτ8, Δτ12, . . . , and calculates post-interpolation filter-coefficients cx1 to cx7 associated with the corrected resampling time tx4, tx8, tx12, . . . , respectively, set by the resampling setting unit 35. The filter-coefficient interpolation calculating unit 363 then supplies each of the post-interpolation filter-coefficients cx1 to cx7 to each of N (N=7) multipliers in the product-sum operating unit 365.

The filtering control unit 366 then inputs into the register unit 364, for example, the amplitude values a1 to a7 of the MR signal D2 at the sampling time t1 to t7 with a center on the resampling time t4 by sequentially reading the amplitude values from the MR signal D2 with the sampling interval T5 (see (a) in FIG. 4) that is supplied at the sampling interval T5 from the quadrature detector 348 and temporarily stored in the data storage unit 360. When the MR signal at the sampling time t4 reaches the center of the register, the filtering control unit 366 supplies an instruction signal to perform a product-sum operation to the product-sum operating unit 365.

The product-sum operating unit 365 that receives the instruction signal then calculates an amplitude value b4 at the corrected resampling time tx4 by performing a product-sum operation of the amplitude values a1 to a7 of the MR signal D2 supplied from the output terminals of the register unit 364 and the post-interpolation filter-coefficients cx1 to cx7 associated with the corrected resampling time tx4, and then updates the amplitude value a4 at the resampling time t4 to the amplitude value b4.

Similarly, the product-sum operating unit 365 calculates amplitude values b8, b12, b16, . . . of the MR signal D2 at the corrected resampling time tx8, tx12, tx16, . . . , and updates the amplitude values a8, a12, a16, . . . at the resampling time t8, t12, t16 . . . to the amplitude values b8, b12, b16 . . . , respectively.

Figure 7:
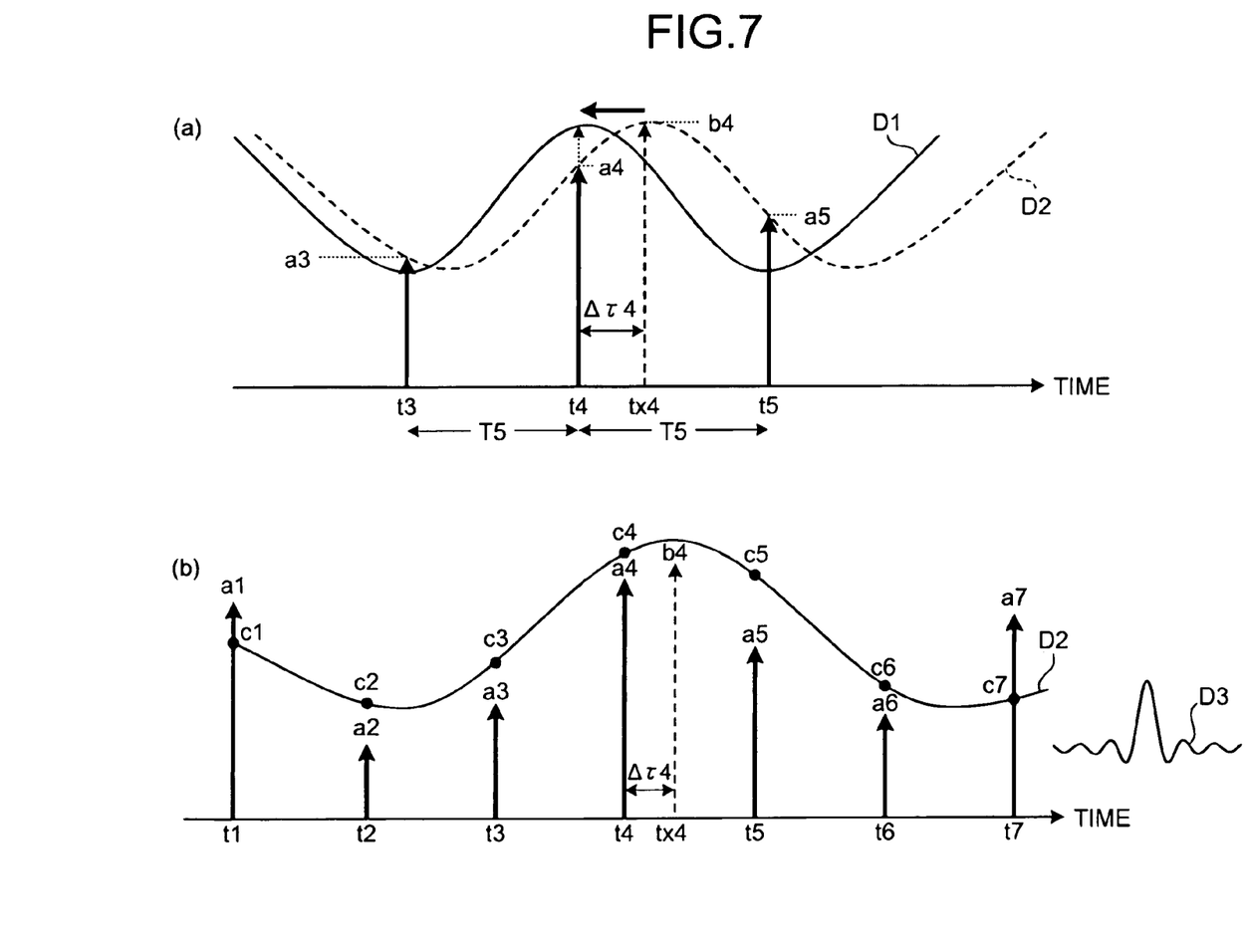
FIG. 7 is a schematic diagram illustrating filtering processing and a correction of an MR-signal frequency according to the embodiment.

FIG. 7 depicts the filtering processing and a correction of the MR-signal frequency performed by the filtering processing unit 36, D1 shown in (a) of FIG. 7 is an MR signal obtained by applying a readout gradient magnetic field of which magnetic field strength does not vary with time, and D2 is an MR signal obtained by applying the sinusoidal readout gradient magnetic field Gra, of which magnetic field strength varies with time. Although a case of performing the filtering processing on an MR-signal data sequence having seven pieces of data is described below, the number of pieces of data to be used in the filtering processing is not limited to seven.

As described above, the filtering processing unit 36 reads the amplitudes a1 to a7 of the MR signal D2 at the sampling time t1 to t7 with a center on the resampling time t4 from the MR signal D2 supplied at the interval T5 from the quadrature detector 348 and temporarily stored in the data storage unit 360. The amplitude value b4 of the MR signal D2 at the corrected resampling time tx4 is calculated by performing a product-sum operation of the amplitudes a1 to a7 and the post-interpolation filter-coefficients cx1 to cx7 of the filter function with a center on the corrected resampling time tx4 created by the filter-coefficient interpolation calculating unit 363. The amplitude value a4 at the resampling time t4 is updated to the amplitude value b4.

Similarly, the amplitude values a8, a12, a16, . . . of the MR signal D2 at the resampling time t8, t12, t16 . . . are also updated to the amplitude values b8, b12, b16, . . . calculated at the corrected resampling time tx8, tx12, tx16, . . . , and so on. In this way, by updating the amplitude values a4, a8, a12, . . . of the MR signal D2 at the resampling time t4, t8, t12, . . . to the amplitude values b4, b8, b12, b16, calculated at the corrected resampling time tx4, tx8, tx12, tx16, . . . , the MR signal of which frequency is corrected (i.e., the MR signal D1 when the magnetic field strength does not vary with time shown in FIG. 5) can be obtained.

On the other hand, (b) of FIG. 7 depicts a calculation method of the amplitude b4 of the MR signal D2 at the corrected resampling time tx4 based on the amplitudes a1 to a7 of the MR signal D2 obtained at the sampling time t1 to t7, and a curve D3 in the figure indicates a filter function of determining post-interpolation filter-coefficients.

In this case, the amplitude b4 of the MR signal D2 can be obtained by convolution integral of the amplitude value a1 to a7 of the MR signal D2 and the post-interpolation filter-coefficients cx1 to cx7 that are created by the filter-coefficient interpolation calculating unit 363 of the filtering processing unit 36 to eliminate the needless MR signal and various noises mixed into the baseband MR signal.

The filter function D3 is obtained by computing the Fourier transform of a band function set in a frequency domain, for example, if the band function is rectangle, the filter function D3 is a sample function (sine function), such as D3 indicated by (b) of FIG. 7.

When calculating the amplitude value b4 of the MR signal D2 at the corrected resampling time tx4, the post-interpolation filter-coefficients cx1 to cx7 are calculated at the sampling time t1 to t7 of the filter function D3 with a center on the corrected resampling time tx4 by performing interpolation processing on the discrete standard filter-coefficients c1 to c7 predetermined at an interval similar to the sampling cycle T5.

The amplitude value b4 of the MR signal D2 at the corrected resampling time tx4 is calculated according to the method described above, and similarly, the amplitude values b8, b12, b16, . . . of the MR signal D2 at the corrected resampling time tx8, tx12, tx16, . . . are calculated.

Figure 8:
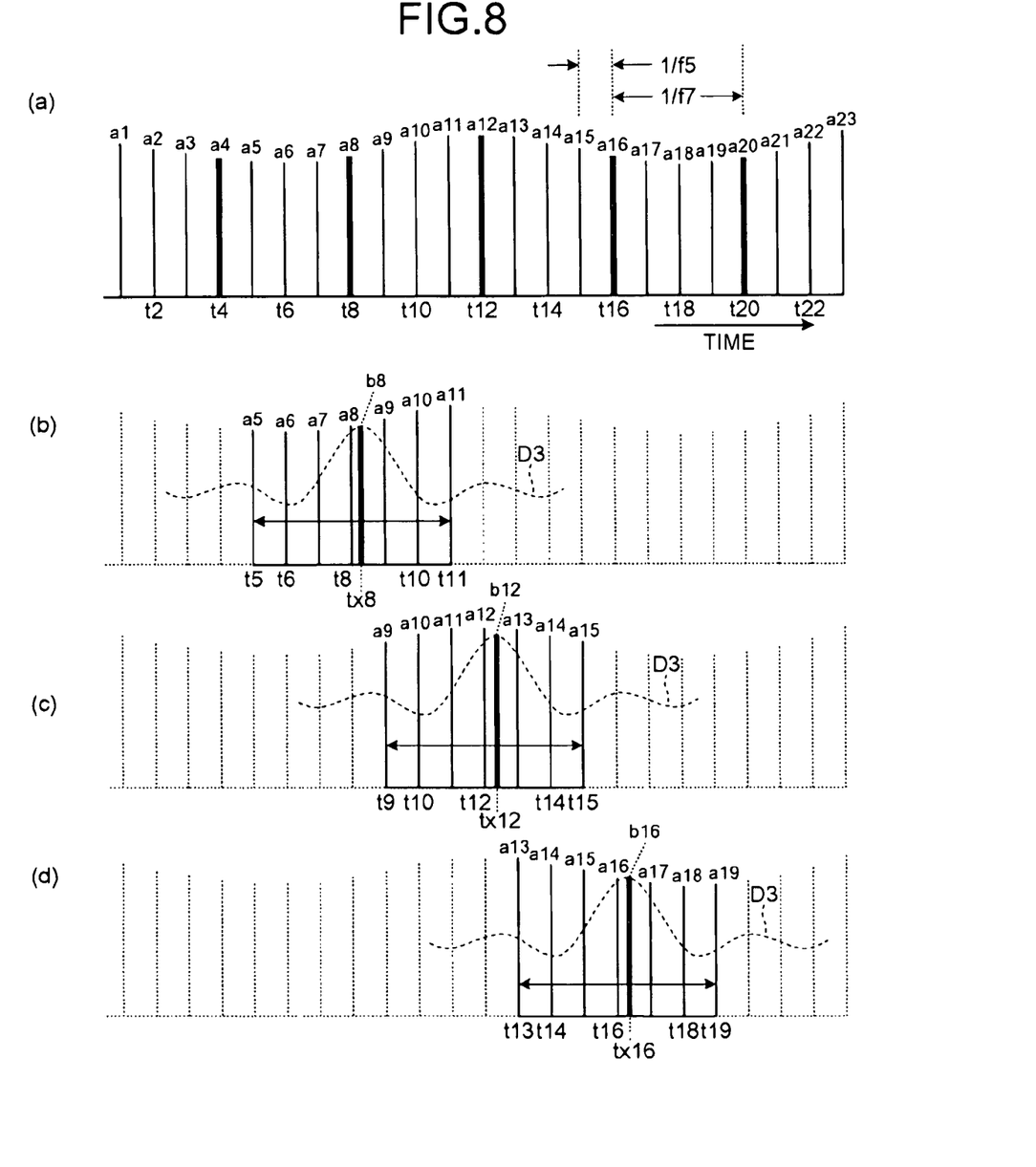
FIG. 8 is a schematic diagram for explaining a calculation method of MR-signal amplitude values at the corrected resampling time according to the embodiment.

FIG. 8 depicts a calculation method of the amplitude values b8, b12, and b16 the MR signal D2 at the resampling time tx8, tx12, and tx16, and (a) of FIG. 8 presents the amplitude values a1 to a23 of the MR signal D2 obtained at the sampling time t1 to t23, and the resampling time (resampling time before correction) t4, t8, t12, t16, and t20.

On the other hand, (b) of FIG. 8 depicts a case of calculating the amplitude value b8 of the MR signal D2 at the corrected resampling time tx8 by performing a product-sum-operation of the amplitude values a5 to a11 of the MR signal D2 at the sampling time t5 to t11 and the post-interpolation filter-coefficients cx1 to cx7 associated with the corrected resampling time tx8. Similarly, (c) of FIG. 8 depicts a case of calculating the amplitude value b12 of the MR signal D2 at the corrected resampling time tx12 by performing a product-sum operation of the amplitude values a9 to a15 of the MR signal D2 at the sampling time t9 to t15 and the post-interpolation filter-coefficients cx1 to cx7 associated with the corrected resampling time tx12, and (d) of FIG. 8 depicts a case of calculating the amplitude value b16 of the MR signal D2 at the corrected resampling time tx16 by performing a product-sum operation of amplitude values a13 to a19 of the MR signal D2 at the sampling time t13 to t19 and the post-interpolation filter-coefficients cx1 to cx7 associated with the corrected resampling time tx16.

Returning to FIG. 1, the tabletop 4 is attached slidably in the z axis direction on the top surface of a not-shown patient couch arranged in the vicinity of the gantry. The tabletop 4 sets a imaging target portion of the subject 150 to a desired position in the imaging field by moving the subject 150 placed on the tabletop 4 in the body axis direction (z axis direction). When setting the imaging target portion, movement of the tabletop 4 is controlled such that the imaging target portion faces to the receiving coil 33 provided in the vicinity of the imaging field.

The tabletop moving-mechanism unit 5 is attached, for example, to the patient couch, creates a tabletop-movement drive signal based on one of tabletop-movement trigger signals (namely, a movement-start trigger signal and movement-stop trigger signal) supplied from a tabletop-movement control unit 93 of the control unit 9, which will be described later, and moves the tabletop 4 in the z axis direction in accordance with the tabletop-movement drive signal.

The image-data creating unit 6 includes a data storage unit 61 and a high-speed computing unit 62, and the data storage unit 61 includes an MR-signal storage unit 611 that stores therein an MR signal, and an image-data storage unit 612 that stores therein image data. The MR-signal storage unit 611 stores therein sequentially in the phase encoding direction an MR signal on which a frequency conversion, an A/D conversion, quadrature detection, and a frequency correction by resampling and filtering processing are performed by the receiving unit 34. The image-data storage unit 612 stores therein image data obtained by performing reconstruction processing on the MR signal.

The high-speed computing unit 62 of the image-data creating unit 6 reads an MR signal stored in the MR-signal storage unit 611, and creates image data by performing image reconstruction processing by a two-dimensional Fourier transform.

The display unit 7 includes a display-data creating circuit, a converting circuit, and a monitor, all of which are not shown. The display-data creating circuit crates display data by combining image data supplied from the image-data storage unit 612 of the image-data creating unit 6, and additional information, such as subject information, supplied from the input unit 8 via the control unit 9. The converting circuit converts the display data into a certain display format, creates an image signal by further performing a D/A conversion and a television-format conversion, and displays an image on the monitor, which can be made of a CRT or a liquid crystal panel.

The input unit 8 includes a display panel and various input devices, such as switches, a keyboard, and a mouse, on an operation panel, and performs input of subject information, setting of collecting conditions of an MR signal and display conditions of image data, setting of the filter characteristic, setting of the readout gradient magnetic field characteristic, setting of a moving speed of the tabletop 4, input of various command signals, and the like.

The control unit 9 includes the main control unit 91, the sequence control unit 92, and the tabletop-movement control unit 93. The main control unit 91 includes a not-shown CPU and a storage circuit, and has a function of totally controlling the MRI apparatus 200. The storage circuit of the main control unit 91 stores therein the subject information, the collecting conditions of an MR signal, the display conditions of image data, the filter characteristic, the readout gradient magnetic field characteristic, the moving speed of the tabletop, and the like, all of which are input or set by the input unit 8.

The CPU of the main control unit 91 sets pulse-sequence conditions based on the information input from the input unit 8 (for example, a size, a feeding period, and feeding timing of a pulse current to be supplied to the gradient magnetic-field coils 21 or the transmitting coil 31), and supplies the set conditions to the sequence control unit 92.

The sequence control unit 92 of the control unit 9 includes a not-shown CPU and a storage circuit, stores the pulse sequence conditions supplied from the main control unit 91 temporarily into the storage circuit, then creates a sequence control signal in accordance with the pulse sequence conditions, and controls the gradient magnetic-field power-source 22 of the gradient magnetic-field generating unit 2 and the transmitting unit 32 of the transmitting/receiving unit 3.

The tabletop-movement control unit 93 of the control unit 9 creates a movement-start trigger signal or a movement-stop trigger signal for movement of the tabletop 4 based on the pulse sequence information supplied from the main control unit 91, or the sequence signal supplied from the sequence control unit 92, and supplies the created signal to the tabletop moving-mechanism unit 5.

According to the embodiment of the present invention described above, when performing the filtering processing on an MR signal collected by using the sinusoidal readout gradient magnetic field that varies with time, a correction of the MR-signal frequency that varies along with temporal variations in the readout gradient magnetic field and the filtering processing for eliminating the needless component mixed in the MR signal can be simultaneously performed. Accordingly, a required time for the processing is reduced, so that a real-time quality of image data during collection can be improved.

Moreover, the correction of the MR-signal frequency and the filtering processing are performed on an MR signal extracted by resampling appropriately to a frequency band of the MR signal collected by using the readout gradient magnetic field, so that a time required for the processing can be further reduced.

Because post-interpolation filter-coefficients with a center on each of the corrected resampling time used for calculating amplitude values of an MR signal at the corrected resampling time are calculated by performing interpolation processing on standard filter-coefficients predetermined at a certain interval, precise filter coefficients (post-interpolation filter-coefficients) can be constantly obtained regardless of the extent of a time-shift amount, consequently, precise filtering processing can be performed.

Having described the embodiment according to the present invention, the present invention is not limited to the embodiment, but can also be modified and implemented. For example, the embodiment is explained above in the case of correcting variations in the MR-signal frequency arising along with temporal variations in the sinusoidal readout gradient magnetic field, however, a readout gradient magnetic field can be in another shape that varies with time during a readout period of the MR signal.

Although it is described above in the case that the filtering processing is performed on an MR signal by using filter coefficients based on the sample function (sinc function) D3, filter coefficients based on other functions can be used.

Furthermore, although it is described above in the case that the shift-amount storage unit 361 that stores therein time-shift amounts preset based on the magnetic-field characteristic of the readout gradient magnetic field is provided in the filtering processing unit 36 of the resampling/filtering processing unit 349, the shift-amount storage unit 361 can be provided in the resampling setting unit 35.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MRI apparatus comprising:
    an application unit that applies a readout gradient magnetic field in which magnetic field strength thereof varies with time and RF pulses to a subject placed in a static magnetic field in accordance with a predetermined pulse sequence;
    a receiving unit that receives an MR signal obtained from the subject to which the readout gradient magnetic field and the RF pulses are applied;
    an AD converter that converts the received MR signal from analog to digital, and samples discrete MR-signal values;
    a filtering processing unit that performs filtering processing on the sampled discrete MR-signal values, including
        a filter-coefficient setting unit that sets a plurality of filter coefficients to be used for the filtering processing with respect to each point of sampling time at which the filtering processing is to be performed, based on time-shift amounts corresponding to variations in an MR-signal frequency arising from temporal variations in the magnetic field strength, and
        a product-sum operating unit that performs the filtering processing on the MR-signal values by performing a product-sum operation between the filter coefficients and the MR-signal values; and
    an image-data creating unit that creates image data based on the MR-signal values on which the filtering processing is performed.

2. The MRI apparatus according to claim 1, wherein the filtering processing is performed for correcting the variations in the MR-signal frequency arising from the temporal variations in the magnetic field strength with the product-sum operating unit.

3. The MRI apparatus according to claim 1, wherein the filtering processing unit performs the filtering processing by setting a larger sampling cycle than a sampling cycle of analog-digital conversion.

4. The MRI apparatus according to claim 3, wherein the filtering processing unit sets the larger sampling cycle based on a signal band of the MR signal.

5. The MRI apparatus, according to claim 1, wherein the filter-coefficient setting unit includes a filter-coefficient interpolation calculating unit, and the filter-coefficient interpolation calculating unit calculates the filter coefficients by performing interpolation processing based on each of the time-shift amounts on standard filter-coefficients of a filter function with a center on each of the sampling time at which the filtering processing is to be performed, the standard filter-coefficients being predetermined with respect to respective points of the sampling time.

6. The MRI apparatus according to claim 5, further comprising:
    a shift-amount storage unit that prestores the time-shift amounts corresponding to respective readout gradient magnetic fields; and
    a filter-coefficient storage unit that prestores standard filter-coefficients corresponding to respective filter characteristics, wherein the filter-coefficient interpolation calculating unit calculates the filter coefficients by performing interpolation processing on the standard filter-coefficients read from the filter-coefficient storage unit based on the filter characteristic of the filtering processing by using the time-shift amounts read from the shift-amount storage unit based on a magnetic-field characteristic of the readout gradient magnetic field.

7. The MRI apparatus according to claim 6, wherein the readout gradient magnetic field has a magnetic field strength of which temporal variations are sinusoidal in shape.

8. The MRI apparatus according to claim 6, wherein the standard filter-coefficients are set as those of a sinc function as a filter function.

9. An MRI method comprising:
    applying a readout gradient magnetic field in which magnetic field strength thereof varies with time and RF pulses to a subject placed in a static magnetic field in accordance with a predetermined pulse sequence;
    receiving an MR signal obtained from the subject to which the readout gradient magnetic field and the RF pulse are applied;
    converting the received MR signal from analog to digital, and sampling discrete MR-signal values;
    performing filtering processing on the sampled discrete MR-signal values, by
        setting a plurality of filter coefficients to be used for the filtering processing with respect to each point of sampling time at which the filtering processing is to be performed, based on time-shift amounts corresponding to variations in an MR-signal frequency arising from temporal variations in the magnetic field strength, and
        performing the filtering processing on the MR-signal values by performing a product-sum operation between the filter coefficients and the MR-signal values; and
    creating image data based on the MR-signal values on which the filtering processing is performed.

* * * * *